(12) United States Patent  
Kim (10) Patent No.: US 9,136,000 B2  
(45) Date of Patent: Sep. 15, 2015

(54) SEMICONDUCTOR MEMORY DEVICE AND METHOD OF OPERATING THE SAME

(71) Applicant: SK hynix Inc., Gyeonggi-do (KR)

(72) Inventor: Min Su Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 36 days.

(21) Appl. No.: 14/198,109

(22) Filed: Mar. 5, 2014

(65) Prior Publication Data

US 2015/0070995 A1 Mar. 12, 2015

(30) Foreign Application Priority Data

Sep. 10, 2013 (KR) ........................ 10-2013-0108573

(51) Int. Cl.
*G11C 16/06* (2006.01)
*G11C 16/08* (2006.01)
*G11C 16/26* (2006.01)
*G11C 16/32* (2006.01)
*G11C 8/08* (2006.01)
*G11C 8/10* (2006.01)

(52) U.S. Cl.
CPC *G11C 16/08* (2013.01); *G11C 8/08* (2013.01); *G11C 8/10* (2013.01); *G11C 16/26* (2013.01); *G11C 16/32* (2013.01)

(58) Field of Classification Search
CPC ........ G11C 16/08; G11C 16/26; G11C 16/32; G11C 8/08; G11C 8/10
USPC ............. 365/185.11, 185.23, 185.24, 230.03, 365/230.06, 230.08, 63, 185.05
See application file for complete search history.

(56) References Cited

U.S. PATENT DOCUMENTS 5,524,235 A * 6/1996 Larson et al. ................. 711/151
5,608,892 A * 3/1997 Wakerly ........................ 711/118
8,363,458 B2 * 1/2013 Lowrey ......................... 365/158

FOREIGN PATENT DOCUMENTS

KR 1019990057918 7/1999

* cited by examiner

*Primary Examiner* — Gene Auduong  
(74) *Attorney, Agent, or Firm* — IP & T Group LLP (57) ABSTRACT

A semiconductor memory device includes an I/O circuit suitable for inputting and outputting data signals, and a control logic suitable for controlling the I/O circuit. The control logic includes a flip-flop suitable for operating in response to a dock signal, which is irrelevant to the data signals, and feed a first output signal back, a first pulse generation circuit suitable for generating a data output control pulse in response to a second output signal of the flip-flop which is an inverted signal of the first output signal, and a second circuit suitable for generating a strobe signal in response to the second output signal.

13 Claims, 5 Drawing Sheets

SEMICONDUCTOR MEMORY DEVICE AND METHOD OF OPERATING THE SAME

CROSS-REFERENCE TO RELATED APPLICATION

The present application claims priority of Korean patent application number 10-2013-0108573, filed on Sep. 10, 2013, the Korean intellectual Property Office, the entire disclosure of which is incorporated herein by reference in its entirety.

BACKGROUND

1. Field of Invention

Various embodiments of the present invention relate to a semiconductor design technology, and more specifically, to a semiconductor memory device and a method of operating the same.

2. Description of Related Art

Semiconductor memory devices are memory devices implemented using a semiconductor such as silicon (Si) germanium (Ge), gallium arsenide (GaAs), indium phosphide (InP), or the like. The semiconductor memory devices may be broadly classified into volatile memory devices or non-volatile memory devices.

A volatile memory device may lose stored data when a power is blocked. The volatile memory device includes a static random access memory (SRAM), a dynamic RAM (DRAM), or the like. A non-volatile memory device may retain the stored data even when not powered. The non-volatile memory device includes a read-only memory (ROM), a mask ROM (MROM), a programmable ROM (PROM), an erasable programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM), and the like. Flash memories are classified into a NOR-type flash memory and a NAND-type flash memory.

Recently, the semiconductor memory device has tendencies of a high integration and a high speed operation. The semiconductor memory device has concerns in operation stability.

BRIEF SUMMARY

Various embodiments of the present invention are directed to a semiconductor memory device that may stably operate at a high speed, and a method of operating the same.

One aspect of the present invention provides a semiconductor memory device comprising: a data I/O block suitable for inputting and outputting data signals; and a control logic suitable for controlling the I/O block, wherein the control logic comprises: a flip-flop suitable for operating based on a clock signal and feeding a first output signal back; a first pulse generation circuit suitable for generating a data output control pulse based on a second output signal of the flip-flop, which is an inverted signal of the first output signal; and a second pulse generation circuit suitable for generating a strobe signal based on the second output signal.

Another aspect of the present invention provides a method of operating a semiconductor memory device comprising: generating an output signal and an inverted output signal by using a flip-flop, wherein the flip-flop receives a clock signal and feeds back the inverted output signal; generating a data output control pulse based on the output signal; and generating a strobe signal based on the output signal.

Another aspect of the present invention provides a semiconductor memory device comprising: a semiconductor memory device; and a controller suitable for controlling the semiconductor memory device, wherein the semiconductor memory device comprises: a data I/O block suitable for inputting and outputting data signals; and a control logic suitable for controlling the I/O circuit, wherein the control logic comprises: a flip-flop suitable for operating based on a clock signal, and feeding a first output signal back; a first pulse generation circuit suitable for generating a data output control pulse based on a second output signal of the flip-flop, which is an inverted signal of the first output signal; and a second pulse generation circuit suitable for generating an strobe signal based on the second output signal.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DESCRIPTION OF EMBODIMENTS

Advantages and features of the present invention, and methods of achieving the same will be described more fully hereinafter with reference to the accompanying drawings, in which exemplary embodiments of the invention are shown. This invention may, however, be embodied in different forms and should not be construed as limited to the embodiments set forth herein. The embodiments of the present invention are provided for explaining in detail to be easily implemented by those of ordinary skill in the art. Throughout the disclosure, reference numerals correspond directly to the like numbered parts in the various figures and embodiments of the present invention.

Throughout the specification, it will be understood that when an element is referred to as being "connected" or "coupled" to another element, it can be directly connected or coupled to the other element or intervening elements may be present. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1:
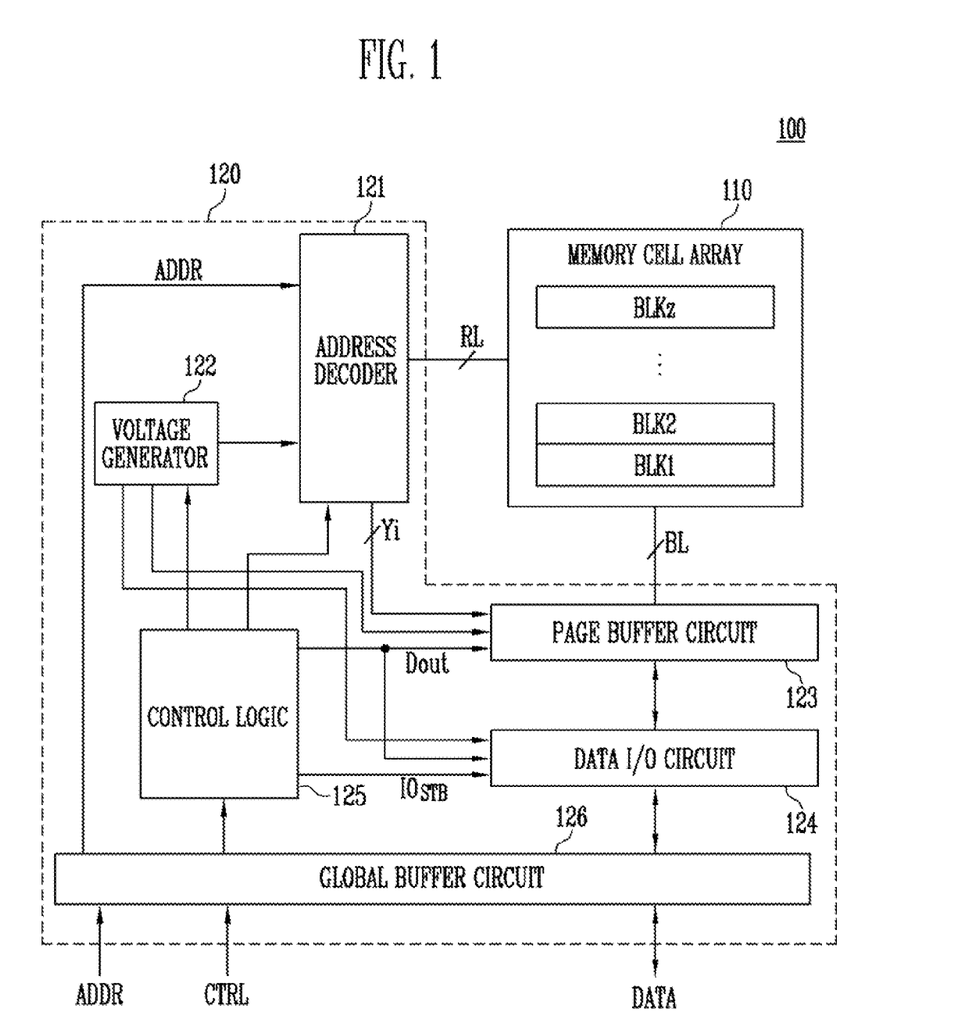
FIG. 1 is a block diagram illustrating a semiconductor memory device according to an exemplary embodiment of the present invention.

FIG. 1 is a block diagram illustrating a semiconductor memory device according to an embodiment of the present invention.

Referring to FIG. 1, a semiconductor memory device 100 may include a memory cell array 110 and a peripheral circuit 120.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a page buffer circuit 123 through bit lines BL. Each of the plurality of memory blocks BLK1 to BLKz includes a plurality of cell strings, and each of the plurality of cell strings includes a plurality of memory cells. As an embodiment, the plurality of memory cells may be non-volatile memory cells. In addition, each of the plurality of memory cells may be defined as a single-level cell or a multi-level cell.

The peripheral circuit 120 is configured to drive the memory cell array 110. The peripheral circuit 120 may include the address decoder 121, a voltage generator 122, the page buffer circuit 123, a data I/O circuit 124, a control logic 125, and a global buffer circuit 126. In the following description, the page buffer circuit 123 and a data I/O circuit 124 are referred to as a data I/O block.

The address decoder 121 is connected to the memory cell array 110 through the row lines RL. The row lines may include drain select lines, word lines, source select lines, and a common source line. The address decoder 121 is configured to drive the row lines RL under the control of the control logic 125. The address decoder 121 receives an address ADDR from the global buffer circuit 126.

The address decoder 121 is configured to decode a block address among the received address ADDR. The address decoder 121 selects at least one memory block corresponding to the decoded block address.

The address decoder 121 is configured to decode a row address among the received address ADDR. The address decoder 121 is configured to apply voltages provided from the voltage generator 122 to the row lines RL corresponding to the decoded row address.

The address decoder 121 is configured to decode a column address among the received address ADDR. The address decoder 121 transfers the decoded column address Yi to the page buffer circuit 123.

A program operation of the semiconductor memory device 100 is performed in units of pages. When the program operation is requested, the block address, the row address, and the column address may be included in the address ADDR. The address decoder 121 may select one memory block, one drain select line, and one word line based on the address ADDR, and provide the decoded column address Yi to the page buffer circuit 123.

The address decoder 121 may include a block decoder a row decoder, a column decoder, and an address buffer.

The voltage generator 122 is configured to generate a plurality of voltages using an external voltage supplied to the semiconductor memory device 100. The voltage generator 122 operates under the control of the control logic 125. The voltages generated from the voltage generator 122 may be used as driving voltages of the address decoder 121, the page buffer circuit 123, the data I/O circuit 124, and the contra logic 125. The voltage generator 122 may include a circuit for regulating the external voltage (or power supply voltage) and generating regulated voltages. In addition, the voltage generator 122 may include a plurality of pumping capacitors, selectively activate the plurality of pumping capacitors, and generate boosted voltages.

The page buffer circuit 123 is connected to the memory cell array 110 through the bit lines BL. The page buffer circuit 123 operates under the control of the control logic 125.

When a data output operation is performed, the page buffer circuit 123 receives a control signal using a data output control pulse Dout from the control logic 125, latches (or receives and stores) data DATA stored in the memory cell array 110 transferred through the bit lines BL, and outputs the latched data DATA to the global buffer circuit 126 through the data I/O circuit 124, in order to output the data DATA through the global buffer circuit 126. When a data input operation is performed, the page buffer circuit 123 latches (or receives and stores) data DATA input to the global buffer circuit 126 through the data I/O circuit 124, and transfers the latched data DATA to bit lines BL selected by the decoded column address Yi among the bit lines BL. The page buffer circuit 123 may include a cache latch unit for latching data.

The data I/O circuit 124 operates for inputting and outputting data between the page buffer circuit 123 and the global buffer circuit 126. The data I/O circuit 124 may include a sensing unit for sensing data output from the page buffer circuit 123 and transferring the sensed data to the global buffer circuit 126.

The control logic 125 is connected to the address decoder 121, the voltage generator 122, the page buffer circuit 123, the data I/O circuit 124, and the global buffer circuit 126. The control logic 125 receives a control signal (or a command) CTRL input through the global buffer circuit 126. The control logic 125 is configured to control overall operations of the semiconductor memory device 100 based on the control signal CTRL.

The control logic 125 may operate additionally based on a clock signal, which is irrelevant to data signals. Further, the control logic 125 may include a flip-flop for operating based on the clock signal and feeding a first output signal back, a first pulse generation circuit for generating the data output control pulse Dout based on a second output signal (i.e., an inverted signal of the first output signal) of the flip-flop, and a second pulse generation circuit for generating a strobe signal $IO_{STB}$ based on the second output signal of the flip-flop. In this case, the control logic 125 may activate the data output control pulse in units of 2N clock cycles (N is a natural number), and generate the strobe signal $IO_{STB}$ using a falling edge of the data output control pulse Dout. In addition, the control logic 125 may control a sensing operation using the data output control pulse Dout and the strobe signal $IO_{STB}$, and start the sensing operation in response to a rising edge of the data output control pulse Dout and end the sensing operation in response to a rising edge of the strobe signal $IO_{STB}$.

The global buffer circuit 126 receives the control signal CTRL and the address ADDR from the outside, and transfers the received control signal CTRL and the address ADDR to the control logic 125 and the address decoder 121, respectively. Further, the global buffer circuit 126 is configured to transfer data DATA from the outside to the page buffer circuit 123 through the data I/O circuit 124, and transfer the data DATA from the page buffer circuit 123 to the outside.

Figure 2:
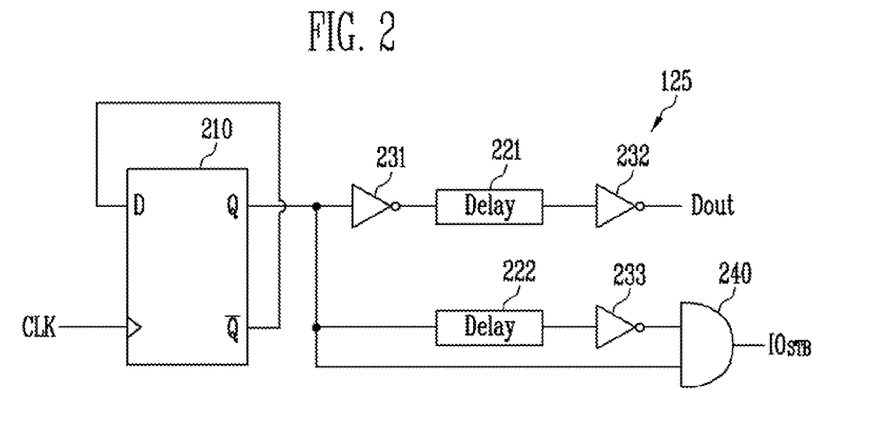
FIG. 2 is a detailed diagram of a control logic shown in FIG. 1.

FIG. 2 is a detailed diagram of the control logic 125 shown in FIG. 1.

Referring to FIG. 2, the control logic 125 may include a flip-flop 210, delays 221 and 222, inverters 231, 232, and 233, and an AND gate 240. The control logic 125 may control a data output operation between the page buffer circuit 123 and the data I/O circuit 124 using such a construction. In this case, the flip-flop 210 may be a D flip-flop. Firstly, the data output operation between the page buffer circuit 123 and the data I/O circuit 124 will be described below with reference to FIGS. 4 and 5.

Figure 4:
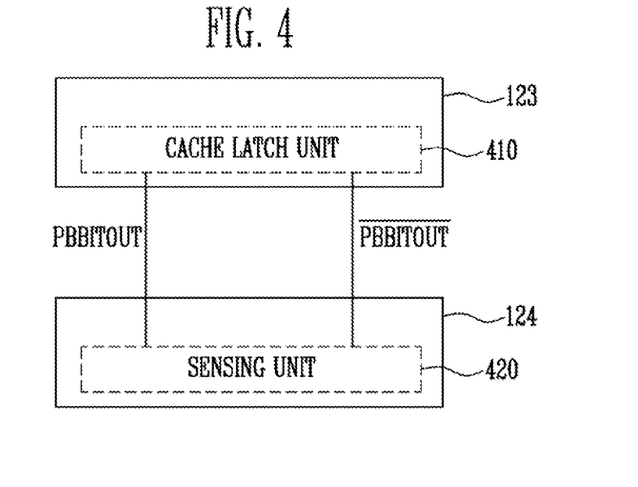
FIG. 4 is a detailed diagram of a page buffer circuit and a data I/O circuit shown in FIG. 1.

FIG. 4 is a detailed diagram of the page buffer circuit 123 and the data I/O circuit 124 shown in FIG. 1.

Referring to FIG. 4, the page buffer circuit 123 may include a cache latch unit 410.

The cache latch unit 410 latches data from the memory cell array 110, and outputs the latched data to the global buffer circuit 126 through the data I/O circuit 124 in respond to the data output control pulse Dout. Further, the cache latch unit 410 may receive data from the global buffer circuit 126 through the data I/O circuit 124.

The data I/O circuit 124 may include a sensing unit 420. The sensing unit 420 senses data output to a data output line, and outputs the sensed data. When a data output operation is performed, the sensing unit 420 senses data output from the cache latch unit 410 through the data I/O line pair PBBITOUT and /PBBITOUT, and outputs the sensed data to the global buffer circuit 126. The sensing unit 420 may be enabled in response to the strobe signal $IO_{STB}$ received from the control logic 125, and perform a data sensing operation on the condition in which the sensing unit 420 is enabled.

Figure 5:
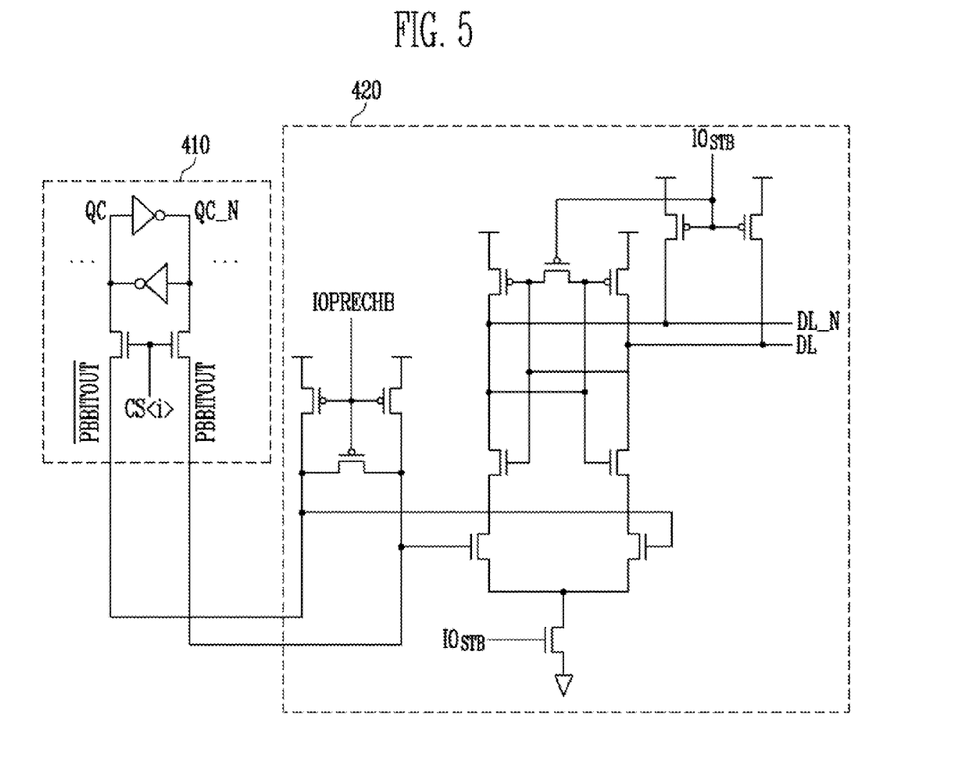
FIG. 5 is a detailed diagram of a cache latch unit and a sensing unit shown in FIG. 4.

FIG. 5 is a detailed diagram of the cache latch unit 410 and the sensing unit 420 shown in FIG. 4.

The cache latch unit 410 receives a column control signal CS, and transfers stored data to the sensing unit 420 through the data I/O line pair PBBITOUT and/PBBITOUT. Here, the column control signal CS (e.g., CS<i>) may be generated by combining (e.g., ANDing) the data output control pulse Dout and the column address Yi (e.g., Yi<i>), and function as an output control signal for the corresponding cache latches. That is, the data output control pulse Dout functions as an output control signal for the cache latches, and the column address Yi functions as a signal for designating a selected column.

The sensing unit 420 receives and senses data stored in the cache latch unit 410 through the data I/O line pair PBBITOUT and/PBBITOUT, and outputs the received and sensed data to the global buffer circuit 126.

Referring to FIG. 4, a precharge signal IOPRECHB may control to precharge the data I/O line pair PBBITOUT and/ PBBITOUT. The precharge operation may be performed when the data output control pulse Dout is deactivated. The strobe signal $IO_{STB}$ may end the sensing operation in response to a rising edge of the strobe signal $IO_{STB}$.

Referring back to FIG. 2, the flip-flop 210 receives the clock signal CLK, which is not related to data signals, and generates the data output control pulse Dout and the strobe signal $IO_{STB}$ based on an output signal of the flip-flop 210. Using the flip-flop 210, the data output control pulse Dout and the strobe signal $IO_{STB}$ may be more stably generated. That is, even though a driving voltage difference between the peripheral circuit 120 and the page buffer circuit 123 is incurred depending on a surrounding environment, an influence due to the surrounding environment may be minimized and a stable data output operation may be performed. Further, since both the data output control pulse Dout and the strobe signal $IO_{STB}$ are generated based on the clock signal CLK, and thus a stable operation may be performed.

Figure 3:
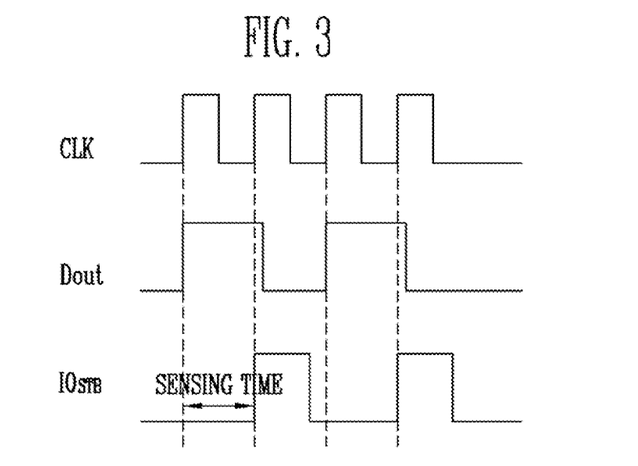
FIG. 3 is a timing diagram for a control logic shown in FIG. 2.

FIG. 3 is a timing diagram for the control logic 125 shown in FIG. 2.

Referring to FIGS. 2 and 3, a data output signal Dout and a strobe signal $IO_{STB}$ are generated using a clock signal CLK. As described above, the control logic 125 activates the data output control pulse in units of 2N clock cycles. For example, in FIG. 3, one data output control pulse is activated for 2 clock cycles.

The control logic 125 may control the sensing operation using the data output control pulse Dout and the strobe signal $IO_{STB}$. Referring to FIGS. 2 and 3, the sensing operation may start in response to a rising edge of the data output control pulse Dout, and end in response to a rising edge of the strobe signal $IO_{STB}$. At this time, a time between the rising edge of the data output control pulse Dout and the rising edge of the strobe signal $IO_{STB}$ may be a sensing time. Accordingly, it can be known that the sensing time is based on the clock signal CLK. Since the clock signal CLK is a clock signal, which is not related to data signals, a stable operation may be performed regardless of the surrounding environment.

Referring back to FIG. 2, the control logic 215 may include a delay circuit, for example, the delay 221, for adjusting the data output control pulse Dout. The delay circuit may finely adjust the timing of the data output control pulse Dout.

Figure 6:
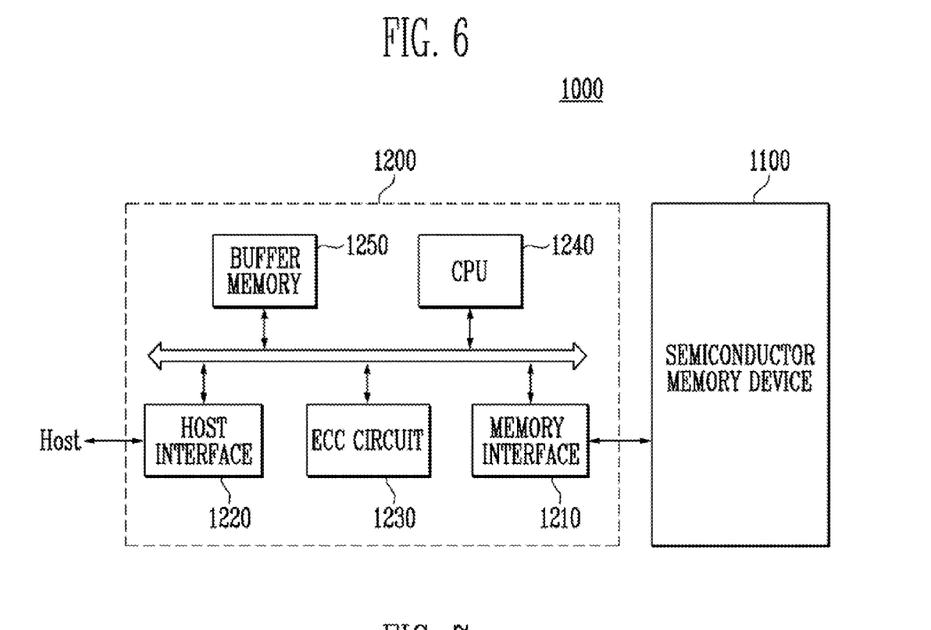
FIG. 6 is a block diagram illustrating a memory system according to an exemplary embodiment of the present invention.

FIG. 6 is a block diagram illustrating a memory system 1000 according to an embodiment of the present invention.

Referring to FIG. 6 the memory system 1000 may include a semiconductor memory device 1100 and a controller 1200.

The semiconductor memory device 110 may have the same construction and operation as the semiconductor memory device 100 described with reference to FIG. 1. Repetitive description will be omitted below.

The controller 1200 is connected to host and the semiconductor memory device 1100. The controller 1200 is configured to access the semiconductor memory device 1100 in response to a request of the host. For example, the controller 1200 is configured to control read, write, erase, and background operations of the semiconductor memory device 1100. The controller 1200 is configured to provide an interface between the semiconductor memory device 1100 and the host. The controller 1200 is configured to drive firmware for controlling the semiconductor memory device 1100.

The controller 1200 may include a memory interface 1210, a host interface 1220, an error check and correction (ECC) circuit 1230, a central processing unit (CPU) 1240, and a buffer memory 1250.

The memory interface 1210 transfers data output from the buffer memory 1250 to the semiconductor memory device 1100. In addition, the memory interface 1210 transfers data read from the semiconductor memory device 1100 to the buffer memory 1250. Here, the memory interface 1210 may use an interface manner of a NAND flash memory. That is, the controller 1200 may perform program, read, and erase operations based on the interface manner of NAND flash memory.

The host interface 1220 may include a protocol for data exchange between the host and the controller 1200. For example, the host interface 1220 is configured to communicate with the host through at least one among various interface protocols such as a universal serial bus (USB), a multimedia card (MMC), a peripheral component interconnect (PCI), a peripheral component interconnect-express (PCI-E), an advanced technology attachment (ATA), a serial advanced technology attachment (SATA), a parallel advanced technology attachment (PATA), a small computer system interface (SCSI), an enhanced small device interface (ESDI), an integrated drive electronics (IDE), a private protocol, and so on.

The ECC circuit 1230 generates a parity bit using data transferred to the semiconductor memory device 1100. The parity bit is stored in the semiconductor memory device 1100. In addition, the ECC circuit 1230 detects an error of data read out from the semiconductor memory device 1100 using the parity bit. If the detected error is within a correctable range, the ECC circuit 1230 corrects the detected error.

The CPU 1240 analyzes and processes a signal input from the host. The CPU 1240 controls the host or the semiconductor memory device 1100 through the host interface 1220 or the memory interface 1210.

The CPU 1240 may control the semiconductor memory device 1110 based on the firmware for controlling the semiconductor memory device 1100.

The buffer memory 1250 temporarily stores program data provided from the host or data read out from the semiconductor memory device 1100. Further, the buffer memory 1250 may store metadata or cache data being stored in the semiconductor memory device 1100. When a sudden power-off occurs, the metadata and the cache data stored in the buffer memory 1250 are stored to the semiconductor memory device 1100. The buffer memory may include a DRAM, an SRAM, or the like.

The semiconductor memory device 1100 and the controller 1200 may be integrated as one semiconductor device, and may be provided as a memory card such as a personal computer memory card international association (PCMCIA), a compact flash card (CF), a smart media card (SM, SMC), a memory stick, a multi media card (MMC, RS-MMC, MMC-micro), a secure digital card (SD, miniSD, microSD, SDHC), a universal flash storage device (UFS), or the like.

The semiconductor memory device 1100 and the controller 1200 may be integrated as one semiconductor device, and configured as a solid-state drive (SSD). The SSD includes a storage device is configured to store data in the semiconductor memory. When the memory system 1000 is used as the SSD, an operating speed of the host connected to the memory system 1000 may be innovatively improved.

As another embodiment, the memory system 1000 may be provided as one among various components of an electronic device such as a computer, an ultra mobile PC (UMPC), a workstation, a netbook, a personal digital assistants (PDA), a portable computer, a web tablet, a wireless phone, a mobile phone, a smartphone, an electronic book, a portable multimedia player (PMP), a portable game player, a navigation device, a black box, a digital camera, a three-dimensional television, a digital audio recorder, a digital audio player, a digital picture recorder, a digital picture player, a digital video recorder, a digital video player, a device for transmitting and receiving information wirelessly, one among various electronic devices configuring a home network, one among various electronic devices configuring a computer network, one among various electronic devices configuring a telematics-based network, a radio frequency identification (RFID) device, one among various components configuring a computing system, or the like.

As an exemplary embodiment, the semiconductor memory device 1100 or the memory system 1000 may be packaged and mounted using a package such as a package on package (POP), a ball grid arrays (BGAs), a chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi chip package (MCP), a wafer-level fabricated package (WFP), a wafer-level processed stack package (WSP), or the like.

Figure 7:
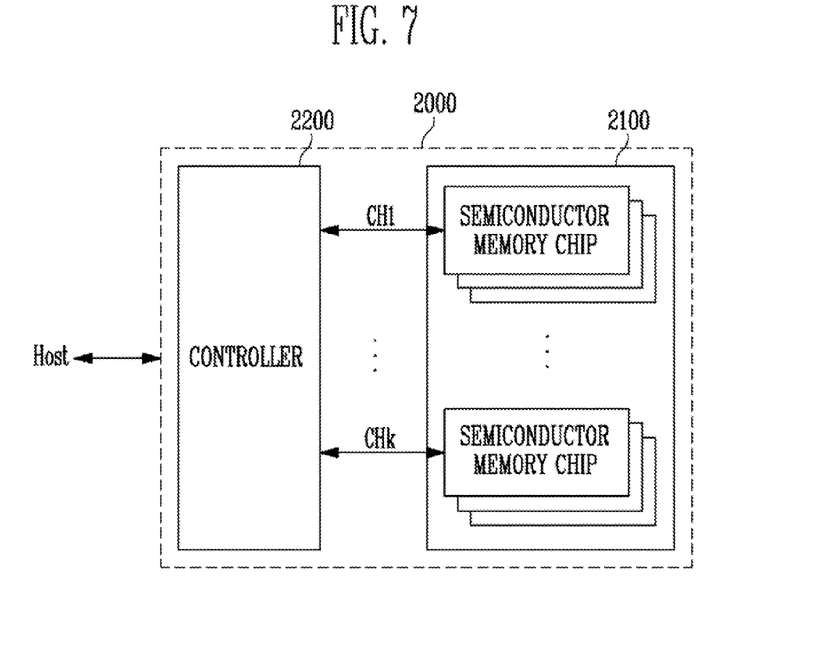
FIG. 7 is a block diagram illustrating an application example of the memory system shown in FIG. 6.

FIG. 7 is a block diagram illustrating an application example of the memory system shown in FIG. 6.

Referring to FIG. 7, a memory system 2000 includes a semiconductor memory device 2100 and a controller 2200. The semiconductor memory device 2100 includes a plurality of semiconductor memory chips. Each of the plurality of semiconductor memory chips has the same construction and operation as the semiconductor memory device 100 described with reference to FIG. 1.

The plurality of semiconductor memory chips are divided into a plurality of groups. In FIG. 12, each of the groups communicates with the controller 2200 through first to k-th channels CH1 to CHk, respectively.

On the other hand, each of the plurality of groups may communicate with the controller 2200 through one common channel. The controller 2200 may have the same construction as the controller 1200 described with reference to FIG. 6, and control the plurality of semiconductor memory chips of the semiconductor memory device 2100 through the plurality of channels CH1 to CHk.

In FIG. 7, the plurality of semiconductor memory chips within a group are connected to one channel. However, one semiconductor memory chip may be connected to one channel.

Figure 8:
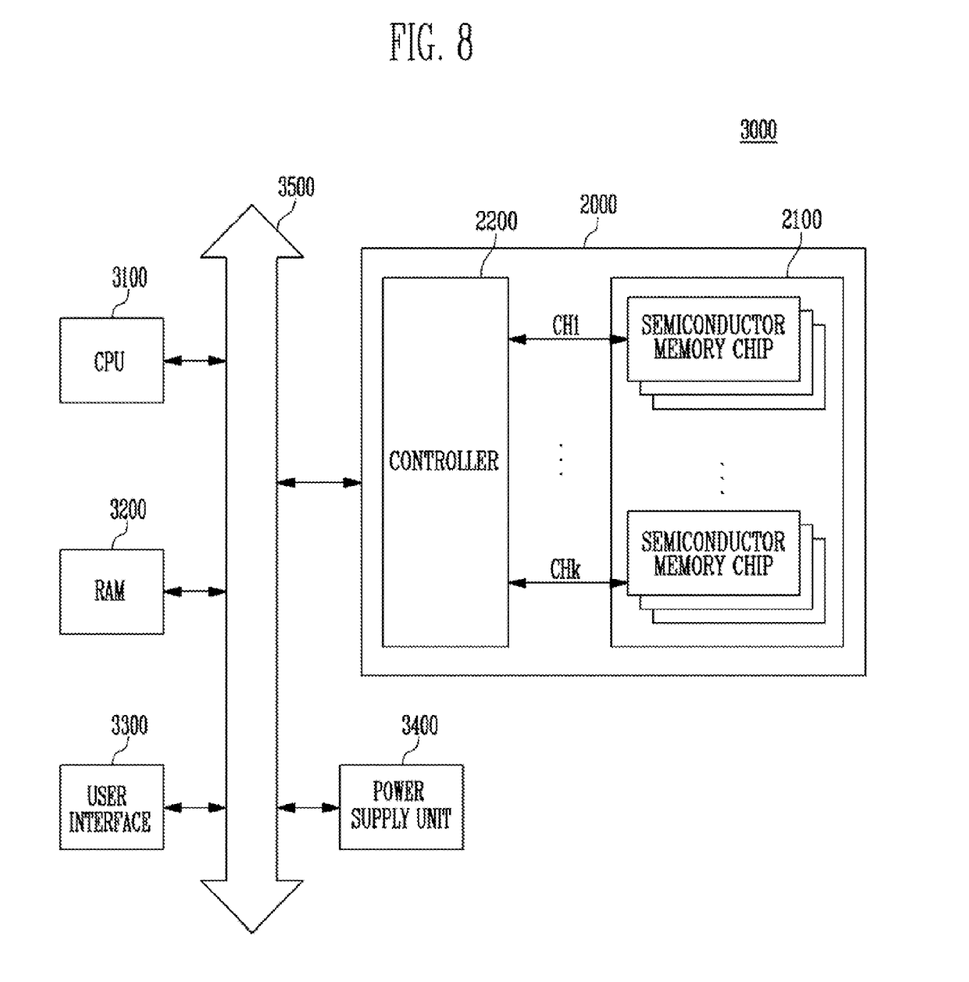
FIG. 8 is a block diagram illustrating a computing system including the memory system shown in FIG. 7.

FIG. 8 is a block diagram illustrating a computing system including the, memory system shown in FIG. 7.

Referring to FIG. 8, a computing system 3000 may include a CPU 3100, a RAM 3200, a user interface 3300, a power supply unit 3400, a system bus 3500, and the memory system 2000.

The memory system 2000 is electrically connected to the CPU 3100, the RAM 3200, the user interface 3300, and the power supply unit 3400 through the system bus 3500. Data provided from the user interface 3300 or processed by the CPU 3100 is stored in the memory system 2000.

In FIG. 8, the semiconductor memory device 2100 may be connected to the system bus 3500 through the controller 2200. However, the semiconductor memory device 2100 may be directly connected to the system bus 3500. In this case, the CPU 3100 and the RAM 3200 may perform the function of the controller 2200.

In FIG. 8, the computing system 3000 is illustrated to include the memory system 2000 described with reference to FIG. 7. However, the memory system 2000 may be replaced by the memory system 1000 described with reference to FIG. 6. In addition, the computing system 3000 may include the memory systems 1000 and 2000 described with reference to FIGS. 6 and 7.

According to the embodiments of the present invention, the semiconductor memory device, the memory system, and the computing system may be stably operated at a high speed.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor memory device, comprising:
   a data I/O block suitable for inputting and outputting data signals; and
   a control logic suitable for controlling the I/O block,
   wherein the control logic comprises:
   a flip-flop suitable for operating based on a clock signal and feeding a first output signal back;

a first pulse generation circuit suitable for generating a data output control pulse based on a second output signal of the flip-flop, which is an inverted signal of the first output signal; and a second pulse generation circuit suitable for generating a strobe signal based on the second output signal.

2. The semiconductor memory device of claim 1, wherein the control logic activates the data output control pulse in units of 2N clock cycles of the clock signal (N is a natural number).

3. The semiconductor memory device of claim 1, wherein the first pulse generation circuit comprises:

a delay circuit suitable for adjusting the data output control pulse.

4. The semiconductor memory device of claim 1, wherein the control logic controls a sensing operation of the data I/O block by using the data output control pulse and the strobe signal.

5. The semiconductor memory device of claim 4, wherein the control logic starts the sensing operation in response to a rising edge of the data output control pulse, and ends the sensing operation in response to a rising edge of the strobe signal.

6. The semiconductor memory device of claim 4, wherein the clock signal is a signal that is not related to the data signals.

7. A method of operating a semiconductor memory device, comprising:

generating an output signal and an inverted output signal by using a flip-flop, wherein the flip-flop receives a clock signal and feeds back the inverted output signal;

generating a data output control pulse based on the output signal; and generating a strobe signal based on the output signal.

8. The method of claim 7, wherein the generating of the data output control pulse is activated in units of 2N clock cycles of the clock signal (N is a natural number).

9. The method of claim 7, further comprising outputting data signals based on the data output control pulse and the strobe signal.

10. The method of claim 7, wherein the generating of the data output control pulse comprises:

adjusting a delay of the data output control pulse.

11. The method of claim 7, wherein the clock signal is a signal that is not related to the data signals.

12. The method of claim 9, wherein the outputting of the data signals comprises:

performing a sensing operation, wherein the sensing operation starts in response to a rising edge of the data output control pulse, and ends in response to a rising edge of the strobe signal.

13. A memory system, comprising:

a semiconductor memory device; and a controller suitable for controlling the semiconductor memory device, wherein the semiconductor memory device comprises:

a data I/O block suitable for inputting and outputting data signals; and a control logic suitable for controlling the I/O circuit, wherein the control logic comprises:

flip-flop suitable for operating based on a clock signal, and feeding a first output signal back;

a first pulse generation circuit suitable for generating a data output control pulse based on a second output signal of the flip-flop, which is an inverted signal of the first output signal; and a second pulse generation circuit suitable for generating an strobe signal based on the second output signal.

* * * * *